United States Patent
Arita

(10) Patent No.: US 8,072,808 B2
(45) Date of Patent: Dec. 6, 2011

(54) NONVOLATILE SEMICONDUCTOR MEMORY DEVICE

(75) Inventor: Makoto Arita, Kyoto (JP)

(73) Assignee: Panasonic Corporation, Osaka (JP)

( * ) Notice: Subject to any disclaimer, the term of this patent is extended or adjusted under 35 U.S.C. 154(b) by 360 days.

(21) Appl. No.: 12/128,184

(22) Filed: May 28, 2008

(65) Prior Publication Data

US 2009/0080255 A1 Mar. 26, 2009

(30) Foreign Application Priority Data

Sep. 26, 2007 (JP) ................................. 2007-248493

(51) Int. Cl.
G11C 11/34 (2006.01)
G11C 7/00 (2006.01)

(52) U.S. Cl. ......... 365/185.09; 365/185.18; 365/185.19; 365/185.24; 365/185.29; 365/200

(58) Field of Classification Search ............. 365/185.09, 365/185.18, 185.19, 185.24, 185.29, 185.11, 365/200, 228
See application file for complete search history.

(56) References Cited

U.S. PATENT DOCUMENTS

| | | | | |
|---|---|---|---|---|
| 4,974,208 A * | 11/1990 | Nakamura et al. | ............ | 365/228 |
| 5,430,675 A * | 7/1995 | Yajima et al. | ............ | 365/185.29 |
| 5,515,324 A * | 5/1996 | Tanaka | ............ | 365/185.09 |
| 5,548,557 A * | 8/1996 | Futatsuya et al. | ........ | 365/185.09 |
| 6,014,329 A * | 1/2000 | Akaogi et al. | ........... | 365/185.09 |
| 6,064,593 A * | 5/2000 | Matsubara et al. | ...... | 365/185.11 |
| 6,111,785 A * | 8/2000 | Hirano | ..................... | 365/185.09 |
| 6,118,704 A * | 9/2000 | Hirata | ..................... | 365/185.24 |
| 6,198,659 B1 | 3/2001 | Hirano | | |
| 6,288,940 B1 * | 9/2001 | Kawamura | ............... | 365/185.09 |
| 6,304,485 B1 * | 10/2001 | Harari et al. | ............. | 365/185.09 |
| 6,421,285 B2 * | 7/2002 | Matsuzaki et al. | ........... | 365/200 |
| 6,487,115 B1 * | 11/2002 | Tsuruda | ................... | 365/185.19 |
| 6,829,178 B2 * | 12/2004 | Koyama et al. | ............. | 365/185.24 |
| 6,879,528 B2 * | 4/2005 | Takeuchi et al. | ............. | 365/200 |
| 6,970,388 B2 * | 11/2005 | Takeuchi et al. | ............. | 365/200 |
| 7,057,937 B1 * | 6/2006 | Matsubara et al. | ...... | 365/185.24 |
| 7,075,835 B2 * | 7/2006 | Fujima | ......................... | 365/200 |
| 7,137,027 B2 * | 11/2006 | Shiota et al. | ............. | 365/185.09 |
| 7,254,060 B2 * | 8/2007 | Kawai et al. | ............. | 365/185.09 |
| 7,272,058 B2 * | 9/2007 | Murakoshi et al. | ...... | 365/185.09 |
| 7,313,022 B2 * | 12/2007 | Takeuchi et al. | ......... | 365/185.09 |
| 7,379,331 B2 * | 5/2008 | Kasai et al. | ............. | 365/185.09 |
| 7,577,035 B2 * | 8/2009 | Kim | ......................... | 365/185.09 |
| 7,619,921 B2 * | 11/2009 | Hosono et al. | ........... | 365/185.09 |
| 7,684,241 B2 * | 3/2010 | Kang et al. | ............. | 365/185.09 |
| 7,724,572 B2 * | 5/2010 | Park et al. | ................ | 365/185.09 |
| 7,729,169 B2 * | 6/2010 | Yano et al. | ................ | 365/185.09 |
| 7,864,580 B2 * | 1/2011 | Tokiwa | ..................... | 365/185.09 |
| 2004/0090847 A1 | 5/2004 | Takeuchi et al. | | |
| 2007/0064482 A1 | 3/2007 | Takeuchi | | |

* cited by examiner

Primary Examiner — Trong Phan
(74) Attorney, Agent, or Firm — McDermott Will & Emery LLP

(57) ABSTRACT

A memory cell array including at least one memory cell, an address storage section containing address information, an address judging circuit for judging whether an input address matches the address information in the address storage section and outputting a result of the judgment, and a write or erase voltage generation circuit for generating a write or erase voltage to be applied to the memory cell are provided. The write or erase voltage generation circuit receives the output result from the address judging circuit and changes a write or erase voltage.

17 Claims, 8 Drawing Sheets

NONVOLATILE SEMICONDUCTOR MEMORY DEVICE

BACKGROUND OF THE INVENTION

1. Field of the Invention

The present invention relates to a nonvolatile semiconductor memory device, and more particularly relates to a technique for remedying defective bits caused in fabrication process steps.

2. Description of the Prior Art

Flash EEPROMs have been known as one type of electrically rewritable nonvolatile semiconductor memory devices. Flash EEPROMs are capable of simultaneously erasing a plurality of memory cells and an erase time can be reduced. Therefore, flash EEPROMs have been widely used in memory cards and the like.

In a flash EEPROM, a write/erase time varies among EEPROM cells. According to a known technique, depending on locations in a memory cell array, a threshold voltage set for each memory cell is made to be variable. This allows reduction in variation in characteristics of memory cells due to the locations of the memory cells and thus improvement of the reliability and write speed of a semiconductor memory device can be achieved (see United States Patent Application No. 2007/0064482A1).

As the capacity of flash EEPROMs has been increased more and more, the problem of reduction in yield arose. Specifically, due to causes in fabrication process steps for fabricating a large capacity flash EEPROM, some completed products in which a specific EEPROM cell requires a long write/erase time than that of a normal EEPROM cell are fabricated. Such products are judged as defectives in a test process step before shipping, so the yield of the flash EEPROM is reduced.

To cope with this problem, a technique in which a redundant circuit is provided to improve a fabrication yield has been used. Specifically, according to the technique using a redundant circuit, besides a normal memory cell array (regular memory cell array), an auxiliary memory cell array, for example, for remedying a defective row of the regular memory cell array and an auxiliary address decoder (programmable decoder) for performing row selection in the auxiliary memory cell array are provided on the same semiconductor chip. Thus, defective cells in the regular memory cell array, which have been found in a test process step in a fabrication stage, are remedied.

SUMMARY OF THE INVENTION

Even when a variation of characteristics of memory cells depending on locations of the memory cells is reduced in the above-described manner, there are cases where an EEPROM cell requiring a long write time and a long erase time are produced unexpectedly due to causes in fabrication process steps. In such case, the product specification is not satisfied and the fabrication yield is reduced.

When a redundant circuit is provided to solve the above-described problem, a redundant memory cell array also has to be provided and thus a circuit size is increased. Accordingly, the chip area of a non-volatile semiconductor memory device is increased, resulting in increase in costs.

To solve these problems, a nonvolatile semiconductor memory device according to an aspect of the present invention is characterized in that the nonvolatile semiconductor memory device includes: a memory cell array including at least one memory cell; an address storage section containing address information; an address judging section for judging whether an input address matches the address information in the address storage section and outputting a result of the judgment; and a control section for controlling a condition for writing or erasing data to or from the memory cell, and the control section receives the output result from the address judging section and changes the condition for writing or erasing data.

According to the present invention, a defective cell produced in a fabrication process step is registered in the address storage section. If an address of the defective cell matches a write address or an erase address, a write voltage or an erase voltage of a different level from a voltage applied to a normal address is applied thereto, so that high speed writing or erasing becomes possible. Also, a defective cell can be remedied without providing a redundant remedy circuit, and thus increase in chip area can be suppressed and a yield can be improved.

Moreover, if a redundant replacement is performed to an EEPROM cell requiring an extremely long write time or an extremely long erase time and a write condition or an erase condition are changed for an EEPROM cell requiring a slightly long write time or a slightly long erase time, a bit size of an auxiliary cell array can be reduced, compared to a known example using redundant replacement to remedy all defective cells, thus allowing reduction in chip size.

DESCRIPTION OF THE PREFERRED EMBODIMENTS

Hereafter, embodiments of the present invention will be described with reference to the accompanying drawings. It should be noted that the technical scope of the present invention is not limited by the following embodiments.

Embodiment 1

Figure 1:
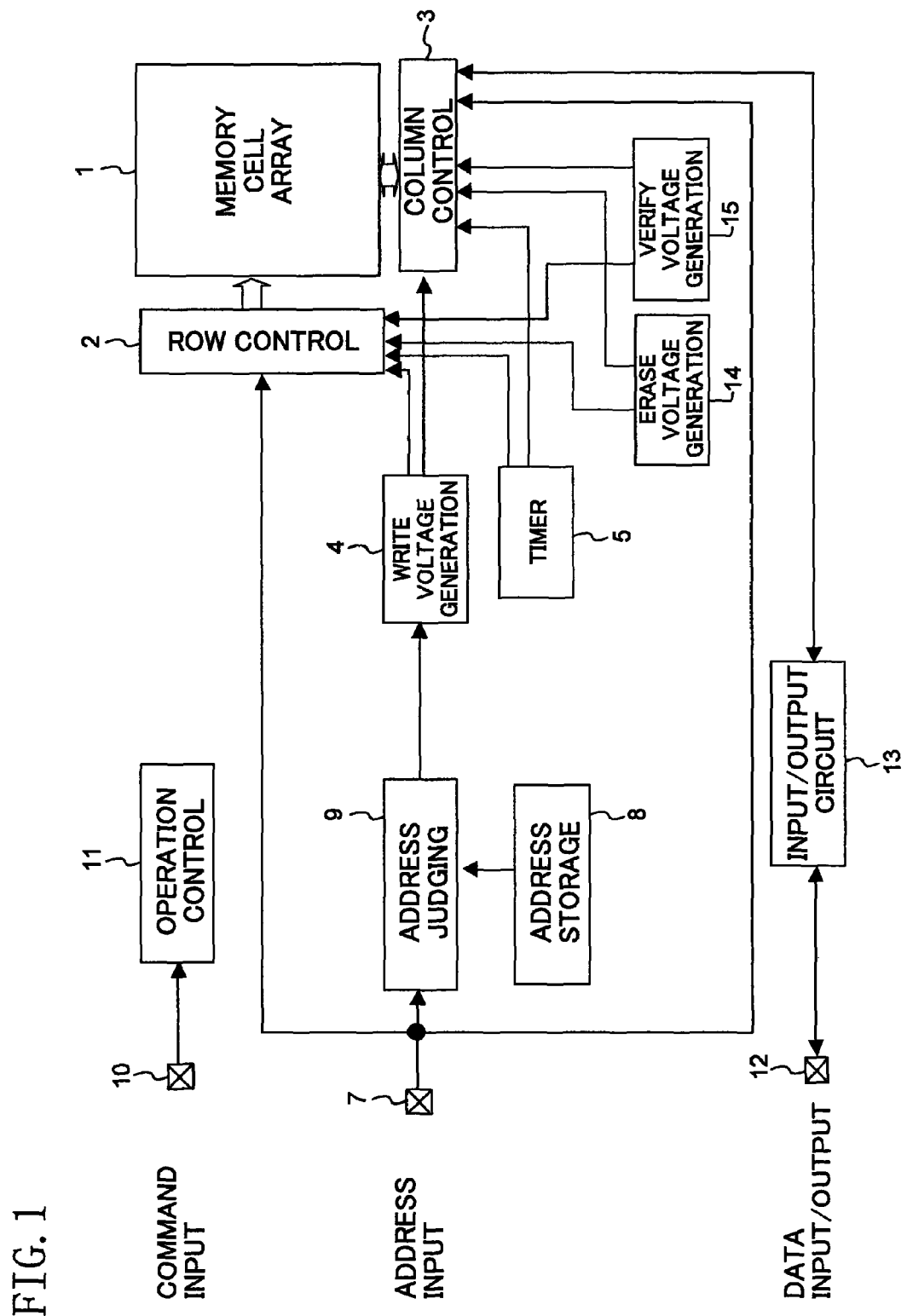
FIG. 1 is a block diagram of a nonvolatile semiconductor memory device according to Embodiment 1 of the present invention.

According to Embodiment 1 of the present invention, the operation of each section of a non-volatile semiconductor memory device will be described with reference to FIG. 1 illustrating a block diagram of the non-volatile semiconductor memory device. It is an object of Embodiment 1 of the present invention to reduce a write time by setting a write voltage for an address at which a long time is required for writing data, to be higher than a write voltage for other addresses.

In FIG. 1, 1 is a memory cell array, 2 is a row control circuit for selecting a word line in the memory cell array 1 and controlling a word line voltage, 3 is a column control circuit for selecting a bit line and a source line in the memory cell array 1 and controlling a sense amplifier and a bit line/source voltage, 4 is a write voltage generation circuit for generating a write voltage, 5 is a timer for controlling a write pulse duration and an erase pulse duration, 7 is an address input terminal, 8 is an address storage section, 9 is an address judging circuit for comparing an address received from the address input terminal 7 to an address registered in the address storage section 8 and outputting match/mismatch information, 10 is a command input terminal, 11 is an operation control circuit for receiving a command from the command input terminal 10 and controlling a write operation and an erase operation, 12 is a data input/output terminal, 13 is an input/output circuit, 14 is an erase voltage generation circuit for generating an erase voltage, and 15 is a verify voltage generation circuit for generating a verify voltage.

Figure 2:
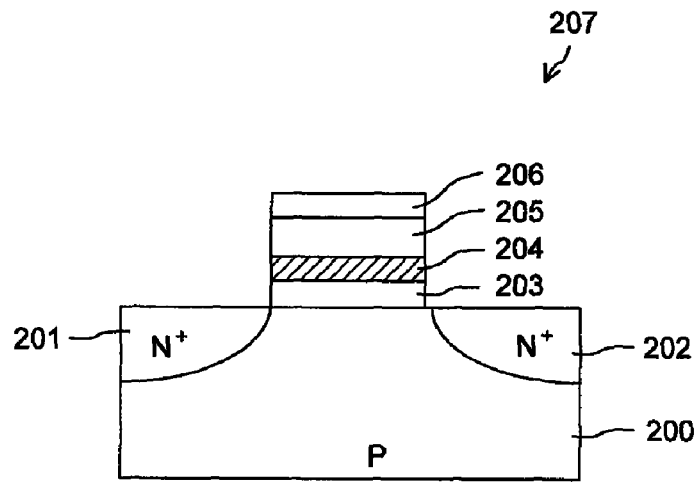
FIG. 2 is a cross-sectional view of an EEPROM cell in a memory cell array of FIG. 1.

FIG. 2 is a cross-sectional view illustrating an exemplary cross-sectional structure of an EEPROM cell used in the memory cell array 1 of FIG. 1. An EEPROM cell 207 of FIG. 2 is formed of a field-effect transistor having a laminated gate structure in which a floating gate electrode is formed as a charge accumulation layer in a gate insulation film. In FIG. 2, 200 is a p-type semiconductor substrate, 201 and 202 are source/drain regions selectively formed of an n-type impurity doped layer in a surface of the semiconductor substrate 200, 204 is a floating gate provided over part of the semiconductor substrate 200 located between a source and a drain with a gate insulation film 203 interposed therebetween, and 206 is a control gate electrode provided on the floating gate with an interlevel insulation film 205 interposed therebetween.

In such a memory cell having the above-described structure, a tunnel current is made to flow from the floating gate 204, the source region 201, the drain region 202 or a back gate to the gate insulation film 203 using Fowler-Nordheim tunneling, tunneling caused by hot carriers (for example, hot electrons) or the like, thereby injecting or releasing charges to or from the floating gate 204. Thus, a data write or erase operation is performed to change a threshold voltage of the memory cell.

Figure 3:
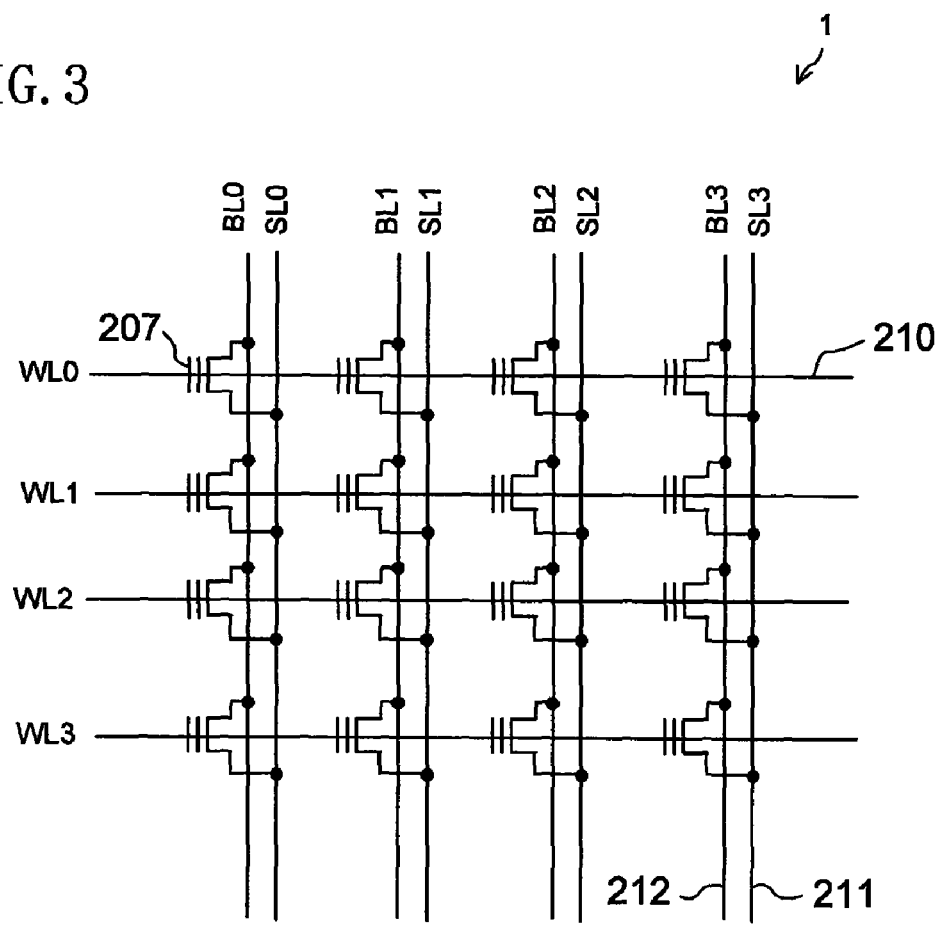
FIG. 3 is a detailed circuit diagram of major part of the memory cell array of FIG. 1.

FIG. 3 is a circuit diagram of major part of the memory cell array 1 including the EEPROM cell 207 of FIG. 2. As shown in FIG. 3, EEPROM cells 207 are arranged in matrix. In each of the EEPROM cells 207, the control gate electrode 206 is connected to an associated one of word lines (WL0 to WL3) 210, the source region 201 is connected to an associated one of source lines (SL0 to SL3) 211, and the drain region 202 is connected to an associated one of bit lines (BL0 to BL3) 212.

In general, when data is written to one of the EEPROM cells 207, a voltage of the semiconductor substrate 200 is set to be 0 V, a positive-side high voltage of about 10 V is applied to a selected word line, a voltage of 5 V is applied to a selected bit line and a voltage of 0 V is applied to a selected source line. Accordingly, hot electrons are generated in the source region of the EEPROM cell 207 and electrons are injected into the floating gate 204 to increase the threshold voltage of the one of the EEPROM cells 207. Also, by setting a voltage of non-selected bit lines connected to the same word line to be the same voltage as a source voltage, i.e., 5 V, a current is prevented from flowing between the source and the drain, so that a write operation is not performed.

When data is erased from one or more of the EEPROM cells 207, a negative-side high voltage of about −10 V is applied to a selected word line and a voltage of +5 V is applied to the semiconductor substrate 200. Thus, electrons stored in the floating gate 204 tunnel through the gate insulation film 203 due to Fowler-Nordheim tunneling and are pulled therethrough, so that the threshold voltage of the one or more of the EEPROM cells 207 is reduced.

The erase voltage generation circuit 14 of FIG. 1 generates voltages to be applied to a word line, a bit line and a substrate of an EEPROM cell when data is erased from the EEPROM cell. The verify voltage generation circuit 15 generates voltages to be applied to a word line, a bit line, a substrate of an EEPROM cell when a verify operation is performed to the EEPROM cell in a write operation and an erase operation.

The write voltage generation circuit 4 generates voltages to be applied to a word line, a bit line and a substrate of EEPROM cell when data is written to the EEPROM cell. The write voltage generation circuit 4 is so configured to receive an output result of the address judging circuit 9 and change a write voltage according to the output result of the address judging circuit 9.

In the EEPROM cells, the higher a write voltage is, the shorter a write time becomes. Therefore, when a result of the address judging circuit 9 indicates that an input address matches address information, a write operation is performed at a higher voltage than a normal voltage and, when the result indicates that an input address does not match address information, a write operation is performed at a normal voltage. Table 1 shows exemplary write voltages.

TABLE 1

|  | Word line voltage | Bit line voltage | Source line voltage | Substrate voltage |
| --- | --- | --- | --- | --- |
| Address match | 11 V | 5.5 V | 0 V | 0 V |
| Address mismatch | 10 V | 5.0 V | 0 V | 0 V |

Figure 4:
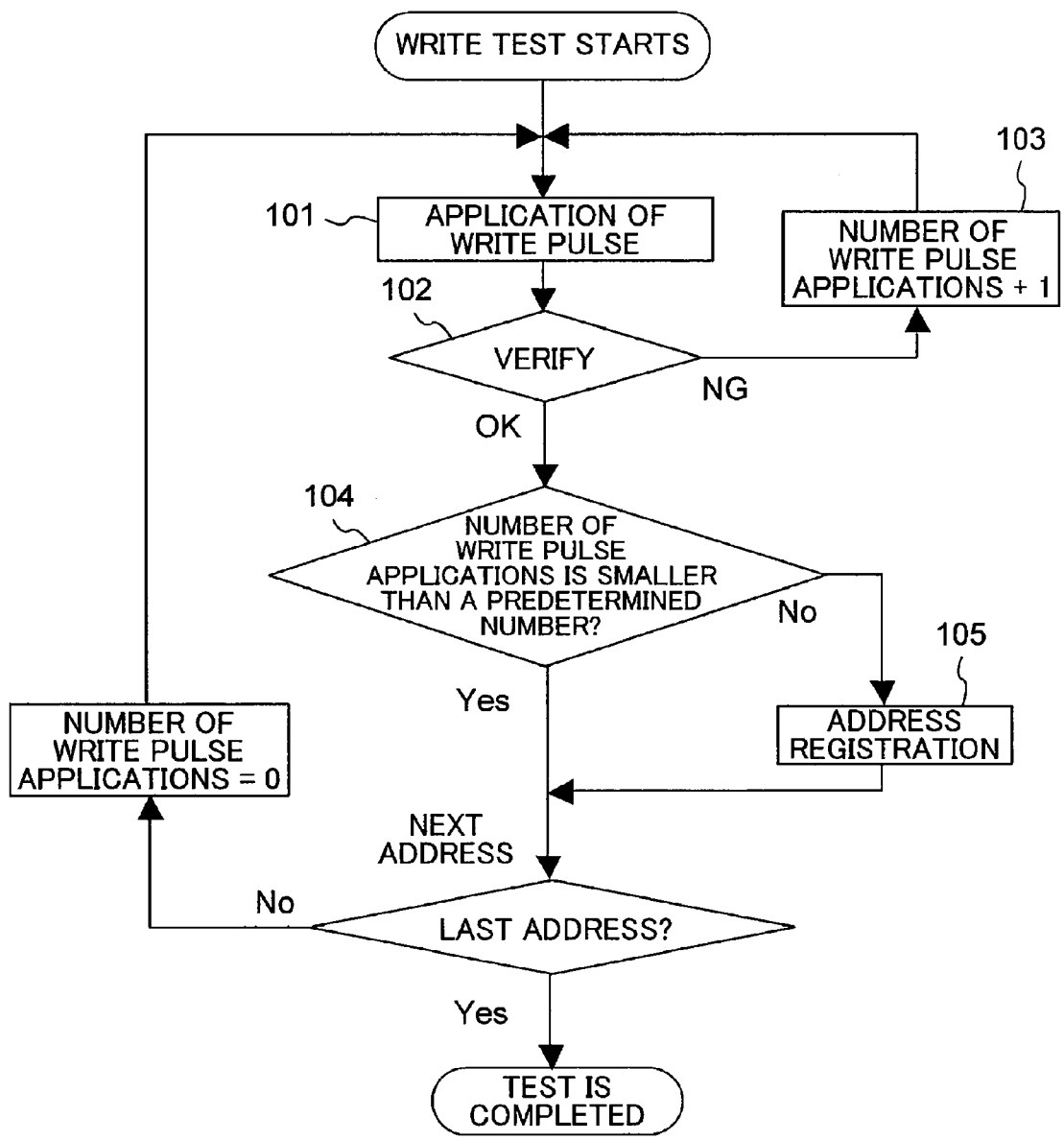
FIG. 4 is a flow chart showing steps for address registration performed in the memory device of FIG. 1 in a shipping test.

FIG. 4 is a flow chart showing steps for detecting an EEPROM cell requiring a long write time and registering the address of the EEPROM cell in the address storage section 8 in a shipping test. In FIG. 4, 101 is a write pulse application step of applying a write voltage to an EEPROM cell for a certain duration, 102 is a verify step of verifying whether the threshold voltage of the EEPROM cell has reached a predetermined voltage, 103 is a step of counting the number of write pulse applications, 104 is a step of checking whether the number of write pulse applications is equal to or smaller than a predetermined number, and 105 is a step of registering an address in the address storage section 8.

Next, the operation when data is written to the nonvolatile semiconductor memory device will be described. In the data write operation, a write command is received from the command input terminal 10 and, at the same time, an address at which data is to be written is received from the address input terminal 7, and write data is received from the data input/output terminal 12.

The address received from the address input terminal 7 is compared, in the address judging circuit 9, to the address information registered in the address storage section 8. A result of the comparison is received by the write voltage generation circuit 4. The write voltage generation circuit 4 generates a write voltage, which is higher than a normal write voltage, when the result of the address judging circuit 9 indicates that the input address matches the address information, and a normal write voltage when the result indicates that the input address does not match the address information.

In general, in a flash EEPROM, to keep the threshold voltage of an EEPROM cell after a writing operation and an erase operation within a certain range, a write verify operation is performed after application of a write pulse in a write operation, and an erase verify operation is performed after application of an erase pulse in an erase operation.

Figure 5:
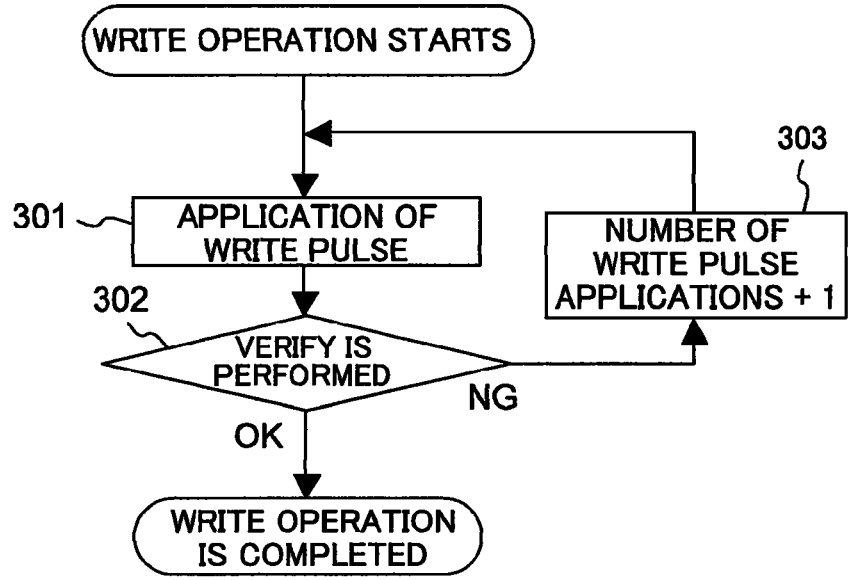
FIG. 5 is a flow chart showing steps for a write operation to an EEPROM cell in the memory device of FIG. 1.

FIG. 5 is a flow chart showing steps for a write operation and a write verify operation. In FIG. 5, 301 is a step of performing a write pulse application operation to a memory cell, 302 is a step of performing a verify operation to verify whether the threshold of the memory cell has shifted to a predetermined value, and 303 is a step of counting the number of write pulse applications.

Referring to FIG. 5, a write pulse is applied and then whether the threshold of the memory cell has shifted to a predetermined value is verified by the verify operation. If the threshold has not reached the predetermined value, a write voltage is applied again and the verify operation is repeatedly performed until the threshold reaches the predetermined value. The larger the number of repeated verify operations is, the longer a write time becomes. Therefore, it is preferable to reduce the number of repeated verify operations.

Figure 6:
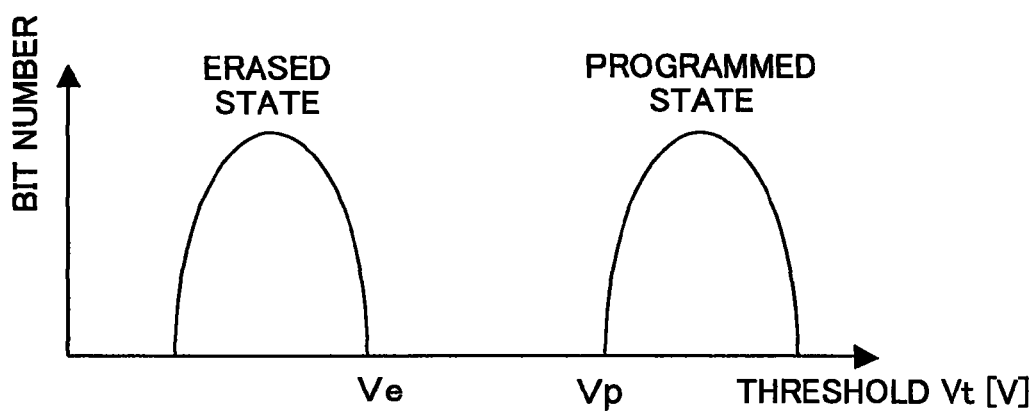
FIG. 6 is a graph showing threshold distribution for EEPROM cells in the memory device of FIG. 1.

FIG. 6 is a graph showing distribution of threshold Vt of EEPROM cells in a flash memory. In FIG. 6, the abscissa indicates the threshold of the EEPROM cells and the ordinate indicates the bit number thereof.

In an erase operation and a write operation, as described above, the threshold of memory cells can be kept within a certain range by performing a verify operation. In this example, a verify operation is performed at a voltage Ve in an erase operation, so that the threshold can be kept within a certain range which is lower than the voltage Ve. On the other hand, when a write operation is performed, a verify operation is performed at a voltage of Vp, so that the threshold can be kept within a certain range which is higher than the voltage Vp.

The flow of FIG. 5 is performed in the same manner in both cases where a result of the address judging circuit 9 indicates that an input address matches address information and where a result of the address judging circuit 9 indicates that an input address does not match address information. However, a voltage applied to the EEPROM cell differs between the case of address match and the case of address mismatch, and a write operation is performed at a higher voltage than a normal voltage to an address requiring a long write time. Thus, the speed of the write operation can be enhanced to about the same speed as the speed of a write operation at other addresses.

According to Embodiment 1 of the present invention, a write operation is performed at a higher voltage to an EEPROM cell requiring a long write time than a voltage to a normal EEPROM cell, so that a write operation can be completed to the EEPROM cell requiring a long write time in a write time equal to a write time for writing data to the normal EEPROM cell.

In Embodiment 1, the write operation has been described. However, an erase operation can be performed in the same manner.

Embodiment 2

Figure 7:
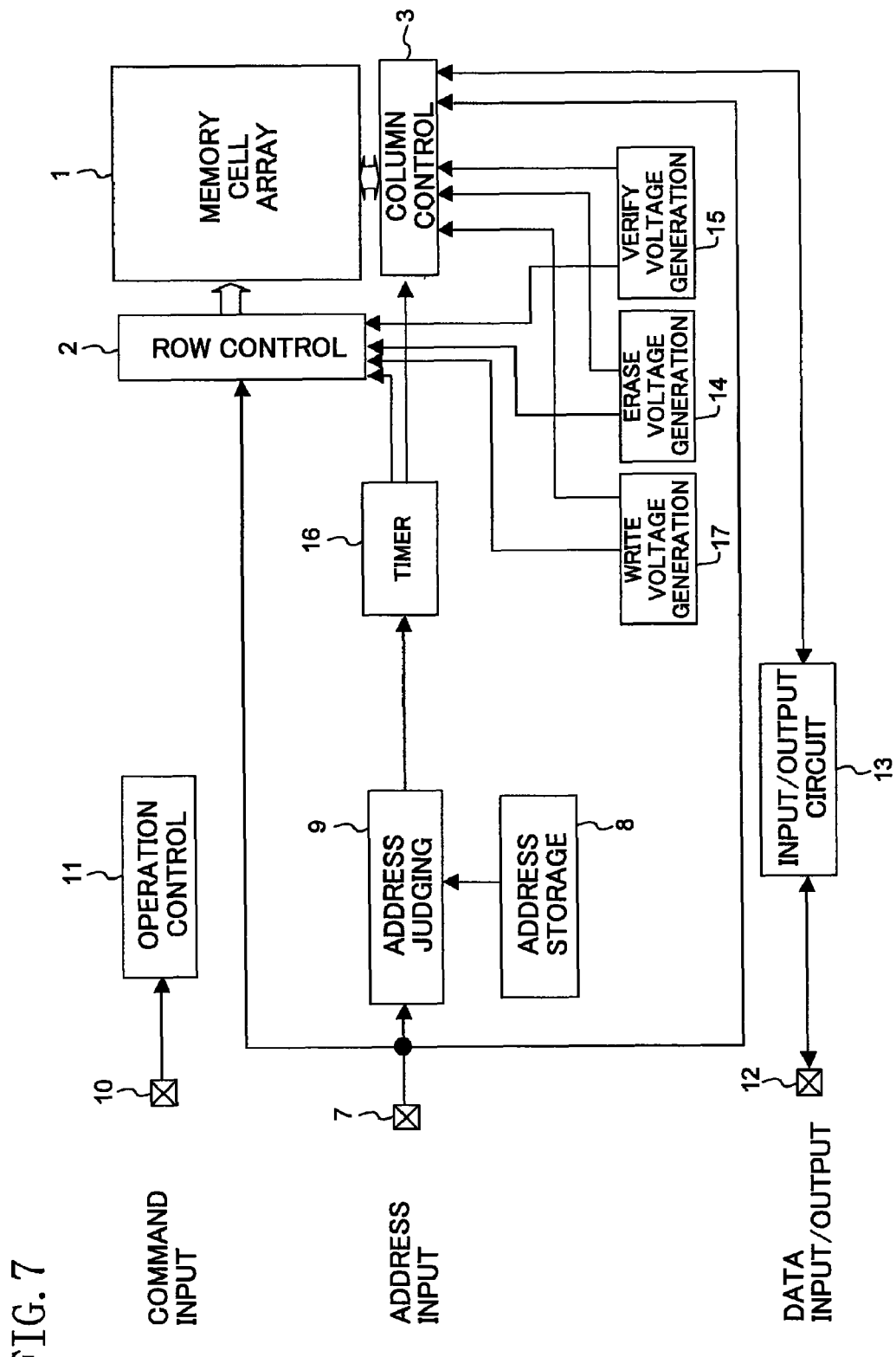
FIG. 7 is a block diagram of a nonvolatile semiconductor memory device according to Embodiment 2 of the present invention.

According to Embodiment 2 of the present invention, the operation of each section of a non-volatile semiconductor memory device will be described with reference to FIG. 7 illustrating a block diagram of the non-volatile semiconductor memory device. In FIG. 7, a memory cell array 1, a row control circuit 2, a column control circuit 3, an address input terminal 7, an address storage section 8, an address judging circuit 9, a command input terminal 10, an operation control circuit 11, a data input/output terminal 12, an input/output circuit 13, an erase voltage generation circuit 14 and a verify voltage generation circuit 15 are the same as those in FIG. 1. In FIG. 7, 16 is a write timer for controlling a write pulse duration, and 17 is a write voltage generation circuit.

The write timer 16 controls a pulse duration for which write voltages are applied to a word line, a bit line, a source line and a substrate of an EEPROM cell. The write timer 16 is so configured to receive an output result of the address judging circuit 9 and change the write pulse duration according to the output result of the address judging circuit 9.

In a write operation to an EEPROM cell, when a low threshold indicating an erased state is shifted to a high threshold, a fluctuation amount of the threshold is increased by increasing a write pulse duration. However, if the pulse duration is increased too much, a variation in a threshold voltage is increased. Therefore, it is important to optimize the write pulse duration.

In a write operation, as shown in FIG. 5, to keep a threshold voltage within a certain range, a write pulse operation and a verify operation are alternately performed. In this case, as shown in Table 2, different voltages are applied as a write voltage and a verify voltage and a set up time of about several hundred micro seconds is required for changing voltages for a word line, a bit line and a source line. The set up time is a relatively large value, compared to a write pulse duration of 1 micro second. Therefore, even if the write pulse duration is doubled, the write time is hardly influenced.

TABLE 2

| | Word line voltage | Bit line voltage | Source line voltage | Substrate voltage |
|---|---|---|---|---|
| Write pulse | 10 V | 5.5 V | 0 V | 0 V |
| Verify | 6 V | — (Sense amplifier connection) | 1.5 V | 0 V |

According to Embodiment 2, if there is an EEPROM cell requiring a long write time, the number of repetitions of write pulse application and a verify operation is reduced by setting the write pulse duration to be long. Thus, the write time can be reduced.

In Embodiment 2, the write operation has been described. However, an erase operation can be performed in the same manner.

Embodiment 3

Figure 8:
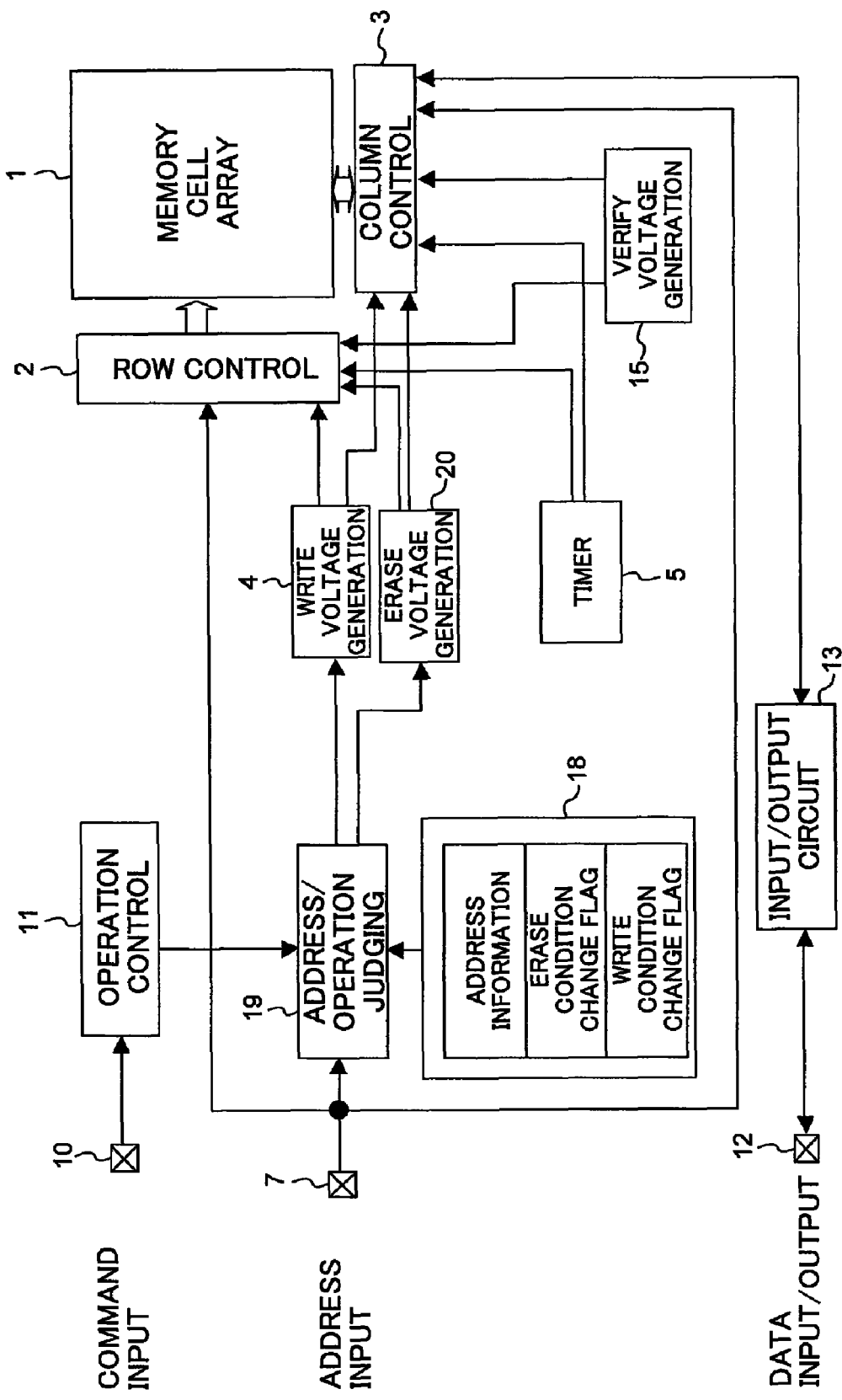
FIG. 8 is a block diagram of a nonvolatile semiconductor memory device according to Embodiment 3 of the present invention.

According to Embodiment 3 of the present invention, the operation of each section of a non-volatile semiconductor memory device will be described with reference to FIG. 8 illustrating a block diagram of the non-volatile semiconductor memory device. In FIG. 8, a memory cell array 1, a row control circuit 2, a column control circuit 3, a write voltage generation circuit 4, a timer 5, an address input terminal 7, a command input terminal 10, an operation control circuit 11, a data input/output terminal 12, an input/output circuit 13 and a verify voltage generation circuit 15 are the same as those in FIG. 1. In FIG. 8, 18 is an address storage section for storing address information, an erase condition change flag and a write condition change flag, 19 is an address/operation judging circuit for comparing an input address received from the address input terminal 7 to the address information in the address storage section 18 and further comparing an operation mode received from the operation control circuit 11 to the erase condition change flag and the write condition change flag from the address storage section 18, and 20 is an erase voltage generation circuit.

In the address storage section 18, address information and the write and erase condition change flags for each address are registered. If a write voltage is changed in writing data to an address, data "1" is registered as the write condition change flag and, if not changed, data "0" is registered as the write condition change flag. If an erase voltage is changed in erasing data from an address, data of "1" is registered as the erase condition change flag and, if not changed, data of "0" is registered as the erase condition change flag. The above-described registration of the write and erase condition flags is performed in such a manner that an EEPROM cell requiring a long write time and an EEPROM cell requiring a long erase time are detected in a shipping test, addresses of the detected EEPROM cells are registered in the address storage section 18, and the write condition change flag and the erase condition change flag are also registered therein for the EEPROM cell requiring a long write time and for the EEPROM cell requiring a long erase time, respectively.

The erase voltage generation circuit 20 generates voltages to be applied to a word line, a bit line and a substrate of an EEPROM cell when data is erased from the EEPROM cell. The erase voltage generation circuit 20 is so configured to receive an output result of the address/operation judging circuit 19 and change an erase voltage according to the output result of the address/operation judging circuit 19.

Next, the operation when data is written to the nonvolatile semiconductor memory device will be described. In the data write operation, a write command is received from the command input terminal 10 and, at the same time, an address at which data is to be written is received from the address input terminal 7 and write data is received from the data input/output terminal 12.

The address received from the address input terminal 7 is compared, in the address/operation judging circuit 19, to the address information registered in the address storage section 18 and also the operation mode received from the operation control circuit 11 is checked against the write condition change flag.

When the input address matches the address information and the write condition change flag is "1", an address match signal is output from the address/operation judging circuit 19 to the write voltage generation circuit 4. The write voltage generation circuit 4 generates voltages shown as voltages for address match in Table 1 and applies write voltages to a word line, a bit line, a source line and a substrate.

When the input address does not match the address information or when the input address matches the address information and the write condition change flag is "0", an address mismatch signal is output from the address/operation judging circuit 19 to the write voltage generation circuit 4. The write voltage generation circuit 4 generates voltages shown as voltages for address mismatch in Table 1 and applies write voltages to a word line, a bit line, a source line and a substrate.

In a data erase operation, an erase command is received from the command input terminal 10 and an address at which data is to be erased is received from the address input terminal 7.

The address received from the address input terminal 7 is compared, in the address/operation judging circuit 19, to the address information registered in the address storage section 18 and also the operation mode received from the operation control circuit 11 is checked against the erase condition change flag.

When the input address matches the address information and the erase condition change flag is "1", an address match signal is output from the address/operation judging circuit 19 to the erase voltage generation circuit 20. The erase voltage generation circuit 20 generates voltages shown as voltages for address match in Table 3 and applies erase voltages to a word line, a bit line, a source line and a substrate.

When the input address does not match the address information or when the input address matches the address information and the erase condition change flag is "0", an address mismatch signal is output from the address/operation judging circuit 19 to the erase voltage generation circuit 20. The erase voltage generation circuit 20 generates voltages shown as voltages for address mismatch in Table 3 and applies write voltages to a word line, a bit line, a source line and a substrate.

TABLE 3

|  | Word line voltage | Bit line voltage | Source line voltage | Substrate voltage |
|---|---|---|---|---|
| Address match | −11 V | open | open | 5.5 V |
| Address mismatch | −10 V | open | open | 5 V |

According to Embodiment 3 of the present invention above, a write operation is performed to an EEPROM cell requiring a long write time at a higher voltage than a voltage to a normal EEPROM cell. Thus, data writing to the EEPROM cell requiring a long write time can be performed within the same amount of time as a time for writing data into the normal EEPROM cell. Also, an erase operation is performed to an EEPROM cell requiring a long erase time at a higher voltage than a voltage to a normal EEPROM cell. Thus, data erasing from the EEPROM cell requiring a long erase time can be performed within the same amount of time as a time for erasing data from the normal EEPROM cell.

Embodiment 4

Next, Embodiment 4 of the present invention will be described. In Embodiments 1 through 3, EEPROM cells are distinguished as two types, i.e., EEPROM cells requiring a long write time and normal EEPROM cells. However, in Embodiment 4 of the present invention, EEPROM cells are distinguished as three types corresponding to three ranks of write times.

Figure 9:
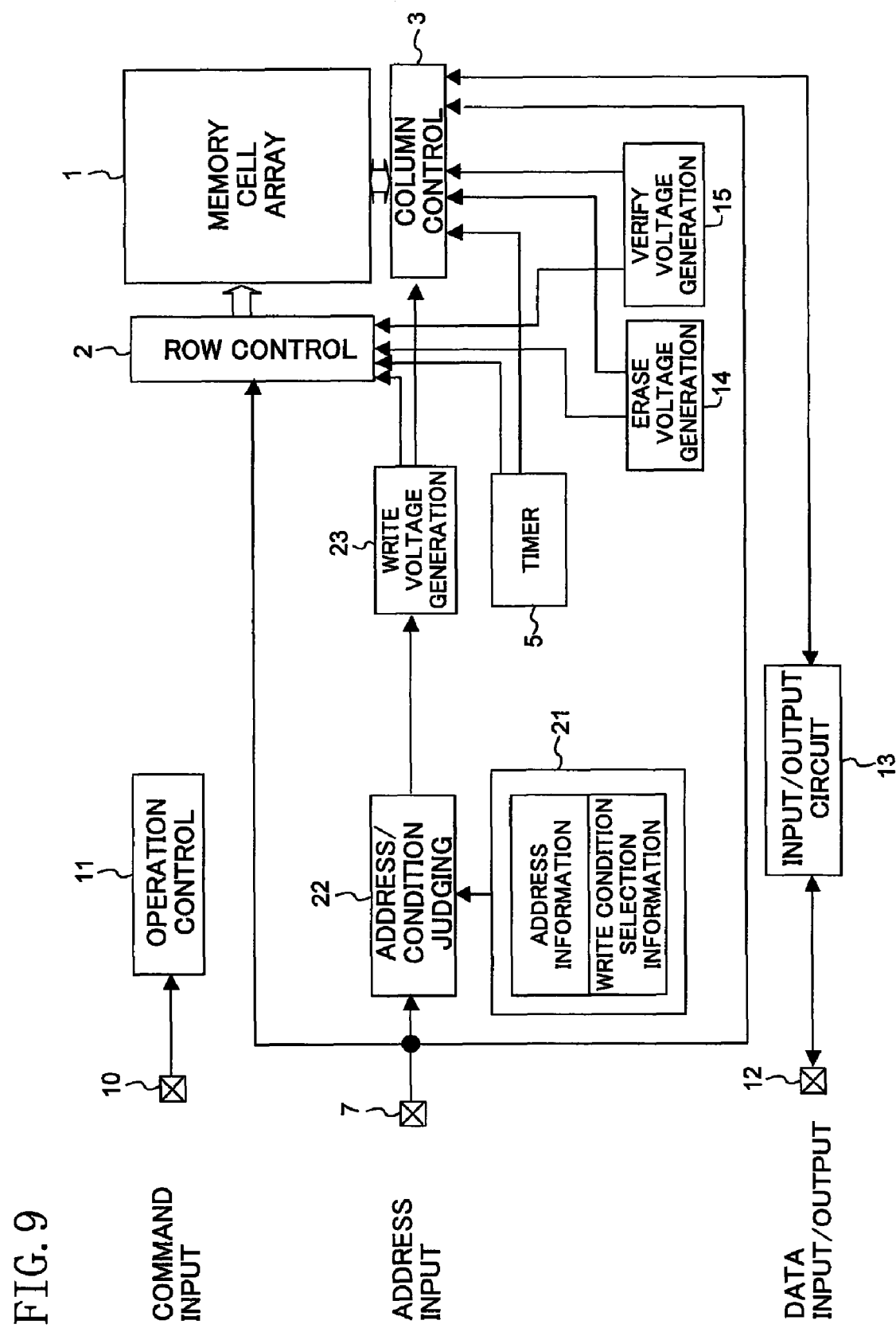
FIG. 9 is a block diagram of a nonvolatile semiconductor memory device according to Embodiment 4 of the present invention.

According to Embodiment 4 of the present invention, the operation of each section of a non-volatile semiconductor memory device will be described with reference to FIG. 9 illustrating a block diagram of the non-volatile semiconductor memory device. In FIG. 9, a memory cell array 1, a row control circuit 2, a column control circuit 3, a timer 5, an address input terminal 7, a command input terminal 10, an operation control circuit 11, a data input/output terminal 12, an input/output circuit 13, an erase voltage generation circuit 14 and a verify voltage generation circuit 15 are the same as those in FIG. 1. In FIG. 9, 21 is an address storage section for storing address information and write condition selection information, 22 is an address/condition judging circuit for comparing an input address from the address input terminal 7 to the address information in the address storage section 21 and further reading out write condition selection information, and 23 is a write voltage generation circuit for generating voltages of three different levels.

In the address storage section 21, the address information and the write condition selection information for each address are registered. As the write condition selection information, data of "0" to indicate Rank 1 and data of "1" to indicate Rank 2 are registered.

The write voltage generation circuit 23 generates voltages applied to a word line, a bit line and a substrate of an EEPROM cell when data is written to the EEPROM cell. The write voltage generation circuit 23 is so configured to receive an output result of the address/condition judging circuit 22 and generates one of the three different level write voltages according to the output result of the address/condition judging circuit 22.

Next, the operation when data is written to the nonvolatile semiconductor memory device will be described. In the data write operation, a write command is received from the command input terminal 10 and, at the same time, an address at which data is to be written is received from the address input terminal 7 and write data is received from the data input/output terminal 12.

The address received from the address input terminal 7 is compared, in the address/condition judging circuit 22, to the address information registered in the address storage section 21 and also the write condition selection information is checked.

When the input address matches the address information and the write condition selection information is "1", an address match signal and a signal for selecting a voltage of Rank 2 are output from the address/condition judging circuit 22 to the write voltage generation circuit 23. The write voltage generation circuit 23 generates voltages shown as voltages for address match (Rank 2) in Table 4 and applies write voltages to a word line, a bit line, a source line and a substrate.

When the input address matches the address information and the write condition selection information is "0", an address match signal and a signal for selecting a voltage of Rank 1 are output from the address/condition judging circuit 22 to the write voltage generation circuit 23. The write voltage generation circuit 23 generates voltages shown as voltages for address match (Rank 1) in Table 4 and applies write voltages to a word line, a bit line, a source line and a substrate.

When the input address does not match the address information, an address mismatch signal is output from the address/condition judging circuit 22 to the write voltage generation circuit 23. The write voltage generation circuit 23 generates voltages shown as voltages for address mismatch in Table 4 and applies write voltages to a word line, a bit line, a source line and a substrate.

TABLE 4

|  | Word line voltage | Bit line voltage | Source line voltage | Substrate voltage |
|---|---|---|---|---|
| Address match (Rank 2) | 11 V | 5.5 V | 0 V | 0 V |
| Address match (Rank 1) | 10.5 V | 5.3 V | 0 V | 0 V |
| Address mismatch | 10 V | 5.0 V | 0 V | 0 V |

According to Embodiment 4 of the present invention, EEPROM cells requiring a long write time can be ranked. Accordingly, a write time of each EEPROM cell requiring a long write time can be reduced and also the threshold voltage after a writing operation can be set within a certain range.

In Embodiment 4, the write operation has been described. However, an erase operation can be performed in the same manner.

Embodiment 5

Embodiment 5 of the present invention will be described next. According to Embodiment 5, both of redundant replacement of a memory cell array with an auxiliary cell array and change of write voltage for writing data to a memory cell array can be selectively used.

Figure 10:
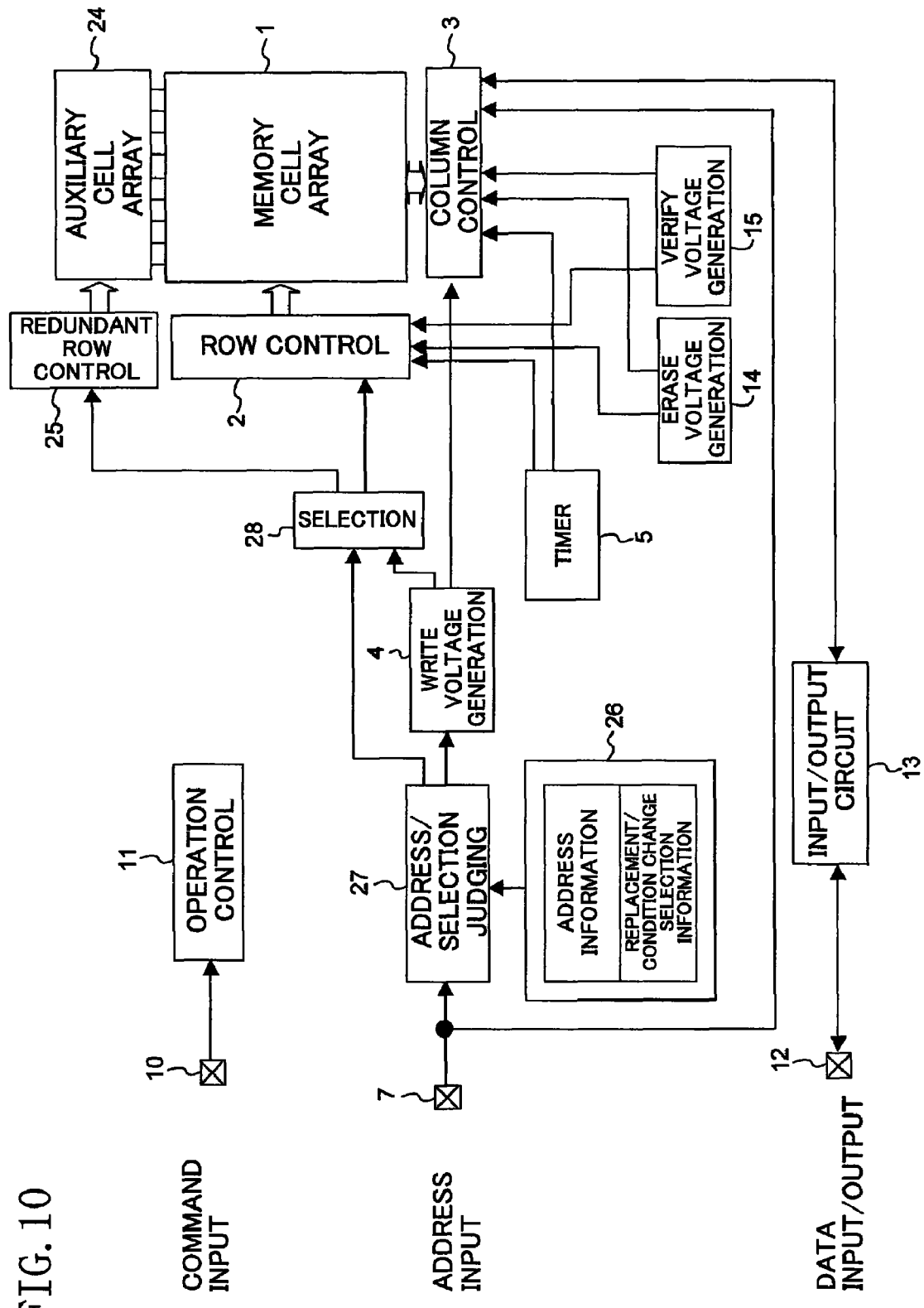
FIG. 10 is a block diagram of a nonvolatile semiconductor memory device according to Embodiment 5 of the present invention.

According to Embodiment 5 of the present invention, the operation of each section of a non-volatile semiconductor memory device will be described with reference to FIG. 10 illustrating a block diagram of the non-volatile semiconductor memory device. In FIG. 10, a memory cell array 1, a row control circuit 2, a column control circuit 3, a write voltage generation circuit 4, a timer 5, an address input terminal 7, a command input terminal 10, an operation control circuit 11, a data input/output terminal 12, an input/output circuit 13, an erase voltage generation circuit 14 and a verify voltage generation circuit 15 are the same as those in FIG. 1. In FIG. 10, 24 is an auxiliary cell array in which memory cells are arranged, as in the EEPROM cell array of FIG. 3, in a row direction along a word line and a column direction along a bit line, 25 is a redundant row control circuit for selecting a word line in the auxiliary cell array 24 and controlling a word line voltage, 26 is an address storage section for storing address information and a replacement/condition change selection information for selecting either redundant replacement or change of a write condition, 27 is an address/selection judging circuit for comparing an input address from the address input terminal 7 to the address information registered in the address storage section 26 and further reading out the replacement/condition change selection information, and 28 is a selection circuit for selecting application of a word line voltage generated by the write voltage generation circuit 4 either to the row control circuit 2 or the redundant row control circuit 25. Bit lines and source lines of the auxiliary cell array 24 are connected to extended portions of the bit lines and source lines of the memory cell array 1, respectively.

The replacement/condition change selection information stored in the address storage section 26 is information for selecting either redundant replacement or change of a write condition without redundant replacement. If data can be written to an EEPROM cell requiring a long write time within the same write time as a write time for wring data to a normal EEPROM cell by performing a write operation at a higher write voltage than a write voltage for writing data to the normal EEPROM cell, a write condition is changed. If a long write time is required even when a write operation is performed at a higher write voltage than a write voltage for writing data to the normal EEPROM cell, redundant replacement can be performed to reduce a write time. That is, redundant replacement is performed to an EEPROM cell requiring an extremely long write time and a write condition is changed for an EEPROM cell requiring a slightly long time for writing data thereto. This allows reduction in bit size of the auxiliary cell array 24, compared to the known example where redundant replacement is performed to all EEPROM cells requiring a long write time. Accordingly, the chip size can be further reduced.

Next, the operation when data is written to the nonvolatile semiconductor memory device will be described. In the data write operation, a write command is received from the command input terminal 10 and, at the same time, an address at which data is to be written is received from the address input terminal 7 and write data is received from the data input/output terminal 12.

The address received from the address input terminal 7 is compared, in the address/selection judging circuit 27, to the address information registered in the address storage section 26 and also the replacement/condition change selection information is checked.

When the input address matches the address information and the replacement/condition change selection information is "1", a redundant replacement selection signal is output to the selection circuit 28. The selection circuit 28 applies a word line voltage generated in the write voltage generation circuit 4 to the redundant row control circuit 25, instead of the row control circuit 2, and performs a write operation to an EEPROM cell in the auxiliary cell array 24.

When the input address matches the address information and the replacement/condition change selection information is "0", a redundant replacement selection signal is not output to the selection circuit 28 and the selection circuit 28 applies a word line voltage generated by the write voltage generation circuit 4 to the row control circuit 2. In this case, an address match signal is output from the address/selection judging circuit 27 to the write voltage generation circuit 4 and the write voltage generation circuit 4 generates write voltages shown as voltages for address match in Table 1. Thus, a write operation is performed to an EEPROM cell in the memory cell array 1 at a higher write voltage than a write voltage for writing data to a normal EEPROM cell, so that a high speed write operation can be achieved.

When the input address does not match the address information, a redundant replacement selection signal is not output to the selection circuit 28 and the selection circuit 28 applies a word line voltage generated by the write voltage generation circuit 4 to the row control circuit 2. In this case, an address mismatch signal is output from the address/selection judging circuit 27 to the write voltage generation circuit 4, the write voltage generation circuit 4 generates write voltages shown as voltages for address mismatch in Table 1 and a write operation is performed under the write condition for a normal EEPROM cell.

According to Embodiment 5 of the present invention, redundant replacement is performed to an EEPROM cell requiring an extremely long write time and a write condition is changed for an EEPROM cell requiring a slightly long write time. Thus, the bit size of the auxiliary cell array can be reduced, compared to the known example where redundant replacement is performed to all EEPROM cells requiring a long write time, thus resulting in reduction in chip size.

In Embodiment 5, the write operation has been described. However, an erase operation can be performed in the same manner.

As has been described, a nonvolatile semiconductor memory device according to the present invention is useful as a technique for remedying defective bits in fabrication process steps while suppressing increase in chip area and improving a yield.

What is claimed is:

1. A nonvolatile semiconductor memory device comprising:
   a memory cell array including at least one memory cell;
   an address storage section containing address information;
   an address judging section for judging whether an input address matches the address information in the address storage section and outputting a result of the judgment; and
   a control section for controlling a condition for writing or erasing data to or from the memory cell, wherein:
   the control section changes the condition for writing data to a memory cell of which address matched the address information in accordance with the output results from the address judging section, and data is written into said memory cell of which address matched the address information, by using the changed condition, or
   the control section changes the condition for erasing data from a memory cell of which address matched the address information in accordance with the output results from the address judging section, and data is erased from said memory cell of which address matched the address information, by using the changed condition.

2. The nonvolatile semiconductor memory device of claim 1, wherein in changing the condition, the control section changes a write voltage for writing data or an erase voltage for erasing data to be applied for said memory cell of which address matched the address information.

3. The nonvolatile semiconductor memory device of claim 2, wherein the write voltage or the erase voltage is controlled by changing a substrate voltage of the memory cell array.

4. The nonvolatile semiconductor memory device of claim 2, wherein the write voltage or the erase voltage is controlled by changing a word line voltage of the memory cell array.

5. The nonvolatile semiconductor memory device of claim 2, wherein the write voltage or the erase voltage is controlled by changing a bit line voltage of the memory cell array.

6. The nonvolatile semiconductor memory device of claim 1, wherein in changing the condition, the control section changes a write pulse duration for writing data or an erase pulse duration for erasing data to which a write pulse or an erase pulse is applied to said memory cell of which address matched the address information.

7. The nonvolatile semiconductor memory device of claim 6, wherein the write pulse duration or the erase pulse duration is controlled by changing a duration for which a voltage is applied to a substrate of the memory cell array.

8. The nonvolatile semiconductor memory device of claim 6, wherein the write pulse duration or the erase pulse duration is controlled by changing a duration for which a voltage is applied to a word line of the memory cell array.

9. The nonvolatile semiconductor memory device of claim 6, wherein the write pulse duration or the erase pulse duration is controlled by changing a duration for which a voltage is applied to a bit line of the memory cell array.

10. The nonvolatile semiconductor memory device of claim 1, wherein the address information in the address storage section includes an address of a memory cell for which a longer write time or a longer erase time than for normal memory cells.

11. The nonvolatile semiconductor memory device of claim 1, wherein the address information in the address storage section includes an address of a memory cell for which a greater number of write pulse applications is required for writing data than for normal memory cells.

12. The nonvolatile semiconductor memory device of claim 1, wherein the address information in the address storage section includes an address of a memory cell of which a threshold voltage does not reach a predetermined value when a constant duration pulse is applied.

13. The nonvolatile semiconductor memory device of claim 1, wherein:
   the address storage section further stores information on whether or not the write condition should be changed and information on whether or not the erase condition should be changed, the control section
- changes the write condition for a write operation according to the output result of the address judging section and the information on whether or not the write condition should be changed, and writes data to said memory cell of which address matched the address information, or
- changes the erase condition for an erase operation according to the output result of the address judging section and the information on whether or not the erase condition should be changed, and erase data from said memory cell of which address matched the address information.

14. The nonvolatile semiconductor memory device of claim 1, wherein:
- the control section is configured to select one of three or more write conditions or one of three or more erase conditions, and
- the address storage section includes information for selecting one of the write conditions or one of the erase conditions of the control section.

15. The nonvolatile semiconductor memory device of claim 1, further comprising at least one redundant replacement memory array,
- wherein the address storage section includes selection information for selecting either:
  - replacement of the memory array including the memory cell of which address matched the address information with the redundant replacement memory array, or
  - change of the condition for writing to or erasing data from said memory cell of which address matched the address information by the control section.

16. A nonvolatile semiconductor memory device comprising:
- a memory cell array including a normal memory cell and a defective memory cell, the defective memory cell requiring a longer writing time or a longer erasing time than the normal memory cell to correctly write or erase a data; and
- a controller for controlling a writing condition for writing a data to or a erasing condition for erasing data from the normal memory cell or the defective memory cell, wherein:
- upon writing a data to or upon erasing data from the defective memory cell, the controller sets a different writing condition or a different erasing condition for the defective memory cell from a writing condition or an erasing condition for the normal memory cell, and
- the data is written into the defective memory cell under said different writing condition or is erased from the defective memory cell under said different erasing condition.

17. The nonvolatile semiconductor memory device of claim 16, wherein:
- upon writing a data to the defective memory cell, the controller sets a higher writing voltage to be applied to the defective memory cell than a writing voltage to be applied for the normal memory cell, and
- the data is written into the defective memory cell with said higher writing voltage.

* * * * *